United States Patent
Dempsey

(10) Patent No.: US 8,912,940 B2
(45) Date of Patent: Dec. 16, 2014

(54) STRING DAC CHARGE BOOST SYSTEM AND METHOD

(71) Applicant: Dennis A. Dempsey, Newport (IE)

(72) Inventor: Dennis A. Dempsey, Newport (IE)

(73) Assignee: Analog Devices Technology, Hamilton (BM)

( * ) Notice: Subject to any disclaimer, the term of this patent is extended or adjusted under 35 U.S.C. 154(b) by 0 days.

(21) Appl. No.: 13/841,150

(22) Filed: Mar. 15, 2013

(65) Prior Publication Data

US 2014/0132435 A1   May 15, 2014

Related U.S. Application Data

(60) Provisional application No. 61/726,431, filed on Nov. 14, 2012.

(51) Int. Cl.
  *H03M 1/78*   (2006.01)
  *H03M 1/08*   (2006.01)
  *H03M 1/68*   (2006.01)
  *H03M 1/76*   (2006.01)

(52) U.S. Cl.
  CPC ............ *H03M 1/0872* (2013.01); *H03M 1/682* (2013.01); *H03M 1/765* (2013.01)
  USPC ............................. 341/154; 341/144; 341/145

(58) Field of Classification Search
  CPC ................. H03M 1/785; H03M 1/76; H03M 2201/3168; H03M 2201/4225; H03M 1/0863; H03M 1/808; H03M 2201/16; H03M 1/0607; H03M 1/466; H03M 1/78; H03M 1/804
  USPC .......................................... 341/144, 145, 154
  See application file for complete search history.

(56) References Cited

U.S. PATENT DOCUMENTS

| 4,338,591 | A | | 7/1982 | Tuthill | |
|---|---|---|---|---|---|
| 4,491,825 | A | | 1/1985 | Tuthill | |
| 4,543,560 | A | | 9/1985 | Holloway | |
| 4,638,303 | A | * | 1/1987 | Masuda et al. | 341/136 |
| 5,075,677 | A | | 12/1991 | Meaney et al. | |
| 5,554,986 | A | * | 9/1996 | Neidorff | 341/145 |
| 5,568,147 | A | | 10/1996 | Matsuda et al. | |
| 5,739,782 | A | | 4/1998 | Uda | |
| 5,764,174 | A | | 6/1998 | Dempsey et al. | |
| 5,831,566 | A | | 11/1998 | Ginetti | |
| 5,877,717 | A | * | 3/1999 | Tu et al. | 341/150 |
| 5,940,020 | A | * | 8/1999 | Ho | 341/145 |
| 5,969,657 | A | | 10/1999 | Dempsey et al. | |
| 6,191,720 | B1 | * | 2/2001 | Zhang | 341/145 |
| 6,346,908 | B1 | * | 2/2002 | Jones, III | 341/172 |
| 6,535,154 | B1 | * | 3/2003 | Sculley | 341/143 |
| 6,914,547 | B1 | | 7/2005 | Swaroop et al. | |
| 6,958,720 | B1 | | 10/2005 | Prater | |

(Continued)

*Primary Examiner* — Linh Nguyen
(74) *Attorney, Agent, or Firm* — Kenyon & Kenyon LLP

(57) ABSTRACT

Embodiments of the present invention may provide a string DAC with charge boosting. The string DAC may include multiple strings, such as an MSB DAC and an LSB DAC, for converting a digital word into a corresponding analog voltage. The string DAC may also include a charge boost system to couple a charge into or out of the DAC during a code transition, such as a MSB code transition. The string DAC may operate in a break-before-make connection technique where all relevant connections are substantially open-circuited before new connections are made. Therefore, the charge boost may shorten the settling time of impedance elements in the string DAC between code transitions and may substantially reduce (or eliminate) glitches.

22 Claims, 12 Drawing Sheets

(56) References Cited

U.S. PATENT DOCUMENTS

| | | |
|---|---|---|
| 7,136,002 B2 | 11/2006 | Dempsey et al. |
| 7,330,143 B2 * | 2/2008 | Kim et al. ............ 341/154 |
| 7,342,527 B2 | 3/2008 | Tsuchi |
| 7,365,670 B2 | 4/2008 | Lan |
| 7,425,912 B2 | 9/2008 | Cosgrave |
| 7,474,245 B1 | 1/2009 | Wang et al. |
| 7,639,166 B2 | 12/2009 | Iijima |
| 7,889,106 B2 * | 2/2011 | Imai ..................... 341/136 |
| 7,956,786 B2 | 6/2011 | Cosgrave |
| 2003/0048830 A1 | 3/2003 | Dickerman et al. |
| 2003/0141998 A1 | 7/2003 | Matsui |
| 2006/0145904 A1 * | 7/2006 | Kim ..................... 341/144 |
| 2007/0152860 A1 | 7/2007 | Jain |
| 2007/0296618 A1 | 12/2007 | Cosgrave et al. |
| 2008/0180295 A1 | 7/2008 | Lan |
| 2009/0207059 A1 * | 8/2009 | Wikner ................ 341/136 |
| 2010/0182175 A1 * | 7/2010 | Oo et al. .............. 341/120 |
| 2010/0245145 A1 | 9/2010 | Motamed |
| 2011/0102227 A1 | 5/2011 | Motamed |
| 2012/0049917 A1 * | 3/2012 | Cook ................... 327/170 |
| 2012/0146828 A1 * | 6/2012 | Narathong et al. ... 341/154 |
| 2012/0326907 A1 | 12/2012 | Hirai |
| 2013/0076549 A1 | 3/2013 | Bajdechi et al. |

\* cited by examiner

200

300

200

400

PRE-CALCULATE BOOST

PRE-CHARGE BOOST INITIAL

PRE-CHARGE BOOST COMPLETION

C_boost-to-DAC
(1st BOOST)

C_boost-to-DAC
(2nd BOOST)

DISCONNECT

600

700

800

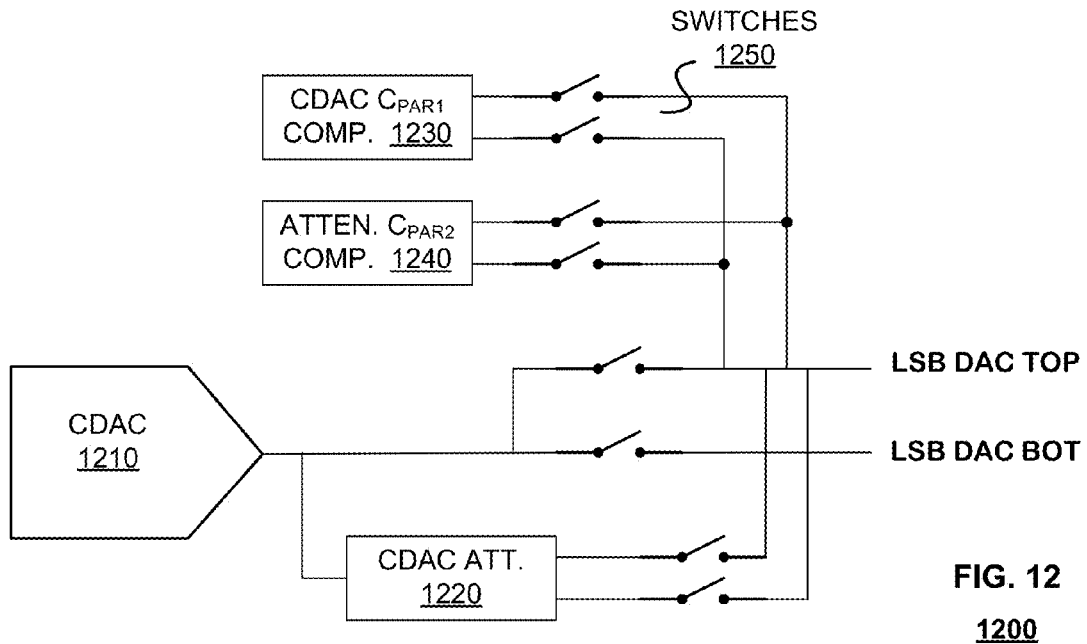
FIG. 12
1200
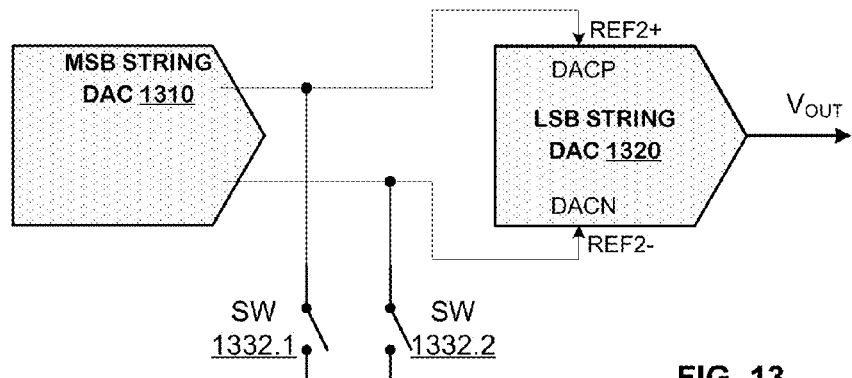
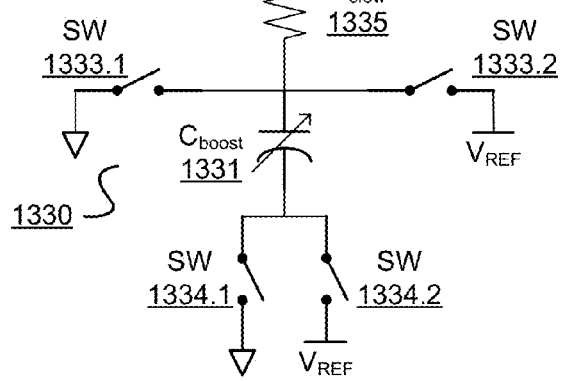
FIG. 13
1300

1400

STRING DAC CHARGE BOOST SYSTEM AND METHOD

CROSS-REFERENCE TO RELATED APPLICATION

This application claims the benefit of priority afforded by provisional U.S. patent application Ser. No. 61/726,431, filed Nov. 14, 2012, the content of which is incorporated herein.

BACKGROUND

The present invention relates to string digital-to-analog converters (DACs), in particular, to charge boosting in string DACs.

String DACs convert a digital word into a corresponding analog signal. Generally, string DACs of single string type include a series connected resistor string and are used for low to moderate resolution. Dual-string DACs have been made with the impedance of the second string unit resistor significantly higher than the impedance of the first string unit resistor to reduce the loading effect to an acceptable level. Dual stage DACs also have used voltage buffers to buffer an intermediate output voltage from the first stage DAC to the second stage DAC, which also may employ a string DAC architecture.

Dual-string DACs typically include two series connected resistor strings and two switch networks respectively for each resistor string. The output of the first resistor string, which is typically used for converting the most significant bits (MSBs) of the digital word, is coupled to the input of the second resistor string, which is used for converting the least significant bits (LSBs) of the digital word.

In dual-string DACs, code transitions in MSB DAC conversion can lead to "glitches" in the LSB DAC conversion due to voltage mismatch. For example, voltage-mode DAC major code transition glitch energy, typically measured in Vsecs, and glitch magnitude, typically measured in Volts peak to peak or V(pk-pk), are transient properties indicative of non-ideal transient responses in the DAC. Glitches can be broadly classified as two types—fast glitches and slow glitches.

Fast glitches occur at the major code transition (MCT) in dual string DACs as a result of high speed charge re-distribution when the LSB DAC is re-coupled to the MSB DAC in the new circuit configuration. This is normally dominated by the high speed [dis-]charging of the LSB DAC reference terminal and the associated switching network as per example shown in FIG. 1(a), which illustrates a MCT glitch causing a fast current path in a simplified dual-string DAC. Fast glitches are generally due to high speed switching and charge re-distribution in low impedance paths, for example between devices that are coupled via metal interconnections, such as switching networks.

Slow glitches, on the other hand, are generally dominated in mult-string DACs by distributed RC settling of the LSB DAC circuitry. FIG. 1(b) illustrates a MCT glitch causing a slow current path in a simplified dual-string DAC. The glitching caused by code transitions also limits the settling time of multi-string DACs as the self-capacitance of the DAC network takes significant time to be charged via the MSB DAC network. The impedance element, such as resistance, has an intrinsic bandwidth due to parasitic capacitance, which limits the settling speed.

In such architecture where output changes are required, the output capacitance is charged via the DAC. The impedance (resistance) of this network limits the charging current and thus the settling speed. This impedance is also important to the DAC static power consumption. It is desirable to have lower power consumption, which is conventionally achieved via higher DAC string impedance, and also reduced settling time, which is conventionally achieved via lower DAC string impedance. Thus, there is a need in the art to overcome this power-speed tradeoff limitation.

Therefore, the inventor recognized a need in the art for increased speed in DACs without substantial additional DAC static power consumption.

BRIEF DESCRIPTION OF THE DRAWINGS

FIG. 12 illustrates a charge boosting system according to an embodiment of the present invention.

FIG. 13 illustrates a DAC system with charge boosting according to an embodiment of the present invention.

DETAILED DESCRIPTION

Embodiments of the present invention may provide string DAC. The string DAC may include an impedance network comprising a first and second impedance strings. The string DAC may also include a set of switches to couple a first voltage across the first impedance string to the second impedance string in a first code configuration and to couple a second voltage across the first impedance sting to the second impedance string in a second code configuration. Further, the string DAC may include a charge boost circuit to inject a boost charge into the impedance network during a transition between the first code configuration and the second code configuration.

Embodiments of the present invention may provide string DAC. The string DAC may include an impedance network comprising a first and second impedance strings. The string DAC may also include a set of switches to couple a first voltage across the first impedance string to the second impedance string in a first code configuration and to couple a second voltage across the first impedance sting to the second impedance string in a second code configuration. Further, the string DAC may include a charge boost circuit to inject a charge after a transition between the first code configuration and the second code configuration.

Embodiments of the present invention may provide a method of converting two digital signals into respective analog signals. The method may include converting a first digital signal into a first analog signal using a multi-string DAC, converting a second digital signal into a second analog signal using the multi-string DAC, and injecting a boost charge signal into the multi-string DAC during a transition between the first and second digital signal conversions.

Embodiments of the present invention may provide a string DAC. The string DAC may include a resistive network comprising a first and second resistor strings, each string comprising a plurality of series-coupled resistors. The string DAC may also include a switch array selectively connecting intermediate nodes in the first resistor string to terminal ends of the second resistor string, the switch array responsive to input control codes to configure the selective connections between the first and second resistor string. Further, the string DAC may include a charge boost circuit to inject a charge into the string DAC during a transition between a first control code and a second control code.

Figure 1A:
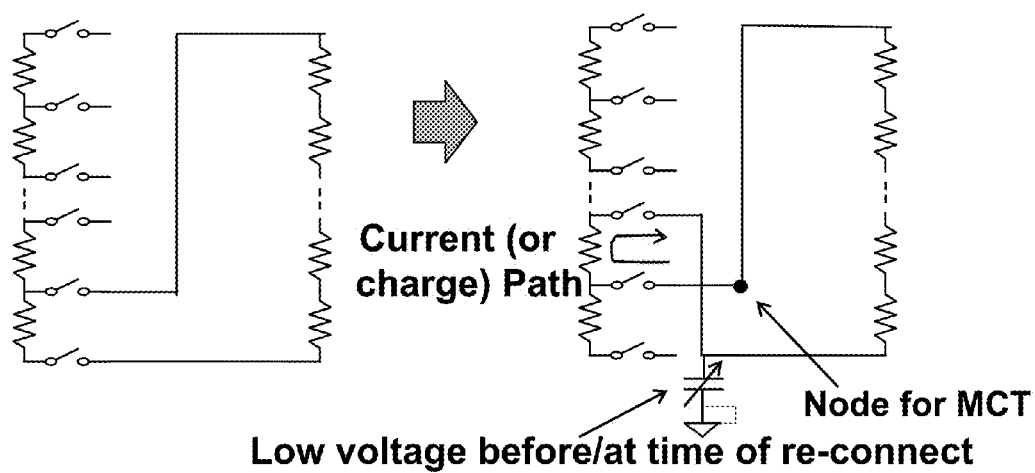
FIG. 1(a) illustrates a fast glitch in a simplified dual-string DAC.
Figure 1B:
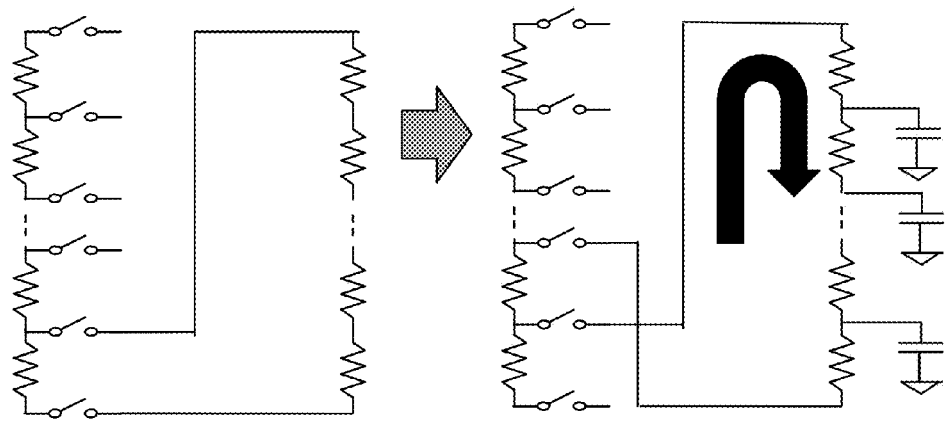
FIG. 1(b) illustrates a slow glitch in a simplified dual-string DAC.
Figure 2A:
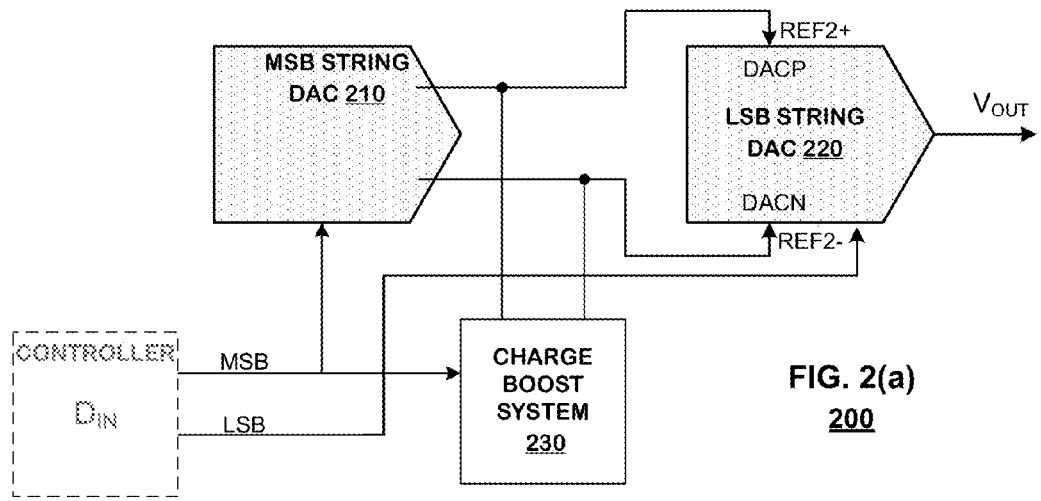
FIG. 2(a) illustrates a DAC system with charge boosting according to an embodiment of the present invention.

FIG. 2(a) is a simplified block diagram of a DAC system 200 with charge boosting according to an embodiment of the present invention. The DAC system 200 may include an MSB DAC 210, an LSB DAC 220, and a charge boost system 230. The DAC system 200 is shown as a binary system split between MSB and LSB portions; however, the DAC systems described herein may be implemented in a variety of different architectures and/or using different number systems (e.g., using relative primes) and/or using non-binary number base. The binary split system is used for simplicity and illustrative purposes herein. The DAC system 200 may convert input digital word $D_{IN}$ into a converted analog voltage $V_{OUT}$.

Figure 2B:
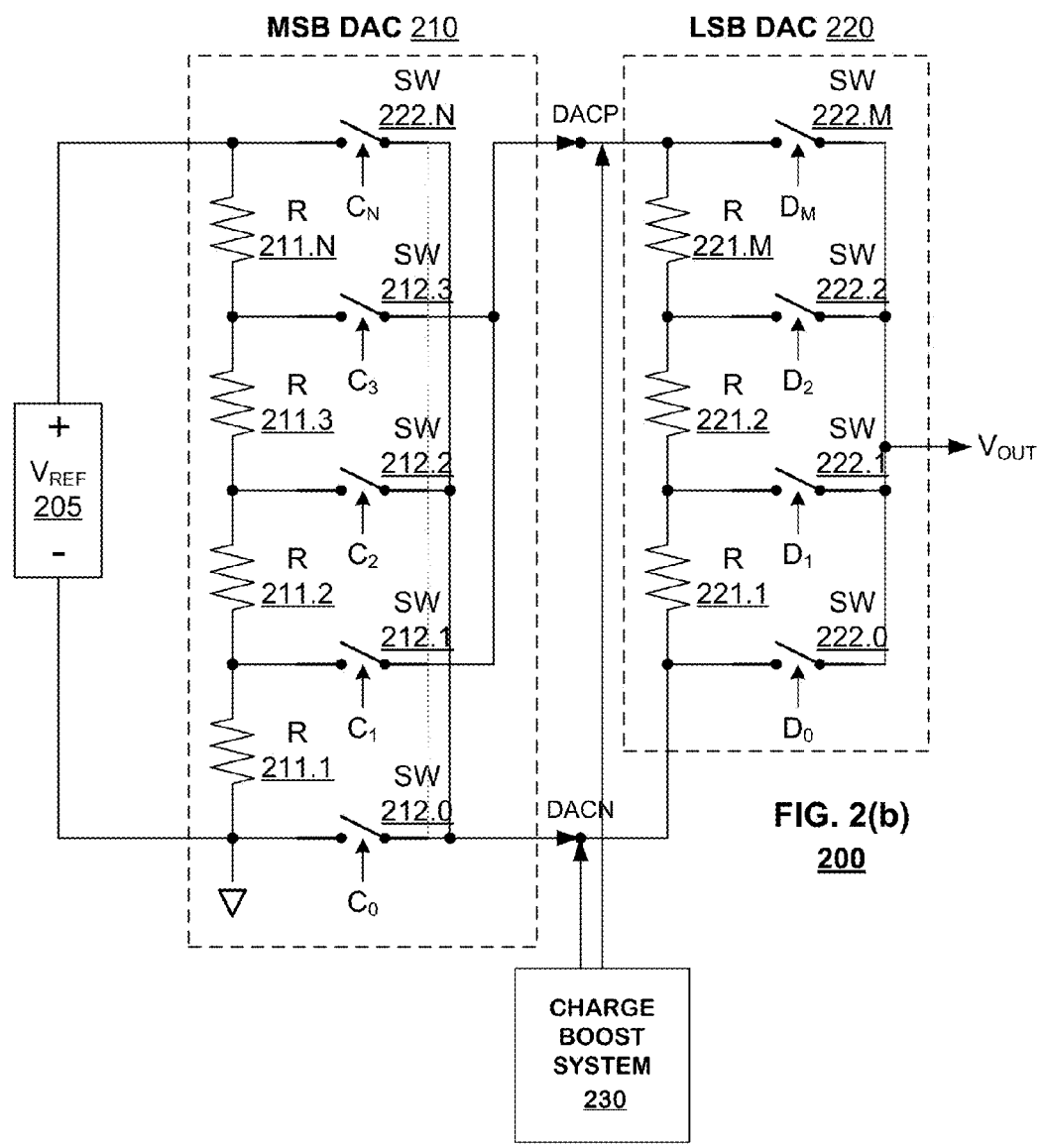
FIG. 2(b) illustrates a DAC system with charge boosting according to an embodiment of the present invention.

The MSB DAC 210 may convert MSB bits of a digital word to be converted to an analog voltage $V_{OUT}$. The MSB DAC 210 may generate reference voltage signal, REF2+ and REF2−. The MSB DAC 210 may include an impedance string with serially-coupled impedance structures such as resistors, MOS devices, etc. In an embodiment, the MSB DAC 210 may be provided as a string DAC as shown in FIG. 2(b). In this embodiment, the MSB DAC 210 may include a plurality of serially-coupled resistors 211.1-211.N (i.e., a resistor string) and a plurality of switches 222.0-222.N. The resistors 211.1-211.N in the resistor string may be provided with equal resistance (e.g., K ohms) to operate as a voltage divider network. The plurality of switches 222.0-122.N may be coupled to the ends of the resistors. Hence, the selective coupling of the switches may provide intermediate nodes corresponding to different sections in the resistor string. The switches may be controlled by binary control signals ($C_0$-$C_N$) based on the MSBs of the digital word to be converted. The switches may be controlled by a controller (shown in phantom in FIG. 2).

Thus, the MSB DAC 210 may provide a portion of reference voltage $V_{REF}$ scaled according to the MSBs of the input digital word.

The LSB DAC 220 may be coupled to the MSB DAC 210 to receive the REF+ and REF− voltages at input nodes DACP and DACN respectively. The LSB DAC 220 may convert LSB bits of the digital word to be converted to $V_{OUT}$. The LSB DAC 220 may include an impedance string with serially-coupled impedance structures such as resistors, MOS devices, etc. In an embodiment, the LSB DAC 220 may be provided as a string DAC as shown in FIG. 2(b). In this embodiment, the LSB DAC 220 may include a plurality of serially-coupled resistors 221.1-211.M (i.e., a resistor string) and a plurality of switches 222.0-222.M. The resistors 221.1-211.M in the resistor string may be provided with equal resistance (e.g., L ohms) to operate as a voltage divider network. The output of the MSB DAC 210 may be coupled to a top and bottom end of the LSB DAC 220 resistor string.

The plurality of switches 222.0-222.M may be coupled to the ends of the resistors. The switches may be controlled by binary control signals ($D_0$-$D_N$) based on the LSBs of the digital word to be converted. The switches may be controlled by a controller (shown in phantom in FIG. 2).

The MSB DAC 210 and LSB DAC 220 may work in combination to convert input digital word $D_{IN}$ into the converted analog voltage $V_{OUT}$. After converting a first digital word, the DAC system 200 may convert another digital word. To do so, the DAC system 200 may change the switch connections in the MSB DAC 210 and LSB DAC 220 based on the new digital word to be converted. However, the DAC system 200 may operate in a break-before-make (BBM) connection technique where all relevant connections are substantially open-circuited before new connections are made. Thus, the design may impose a transition time between code transitions.

The charge boost system 230 may be coupled to the MSB DAC 210 outputs and LSB DAC 220 input references, and may provide a boosting charge to the LSB DAC 220 in between MSB DAC code transitions. The polarity and magnitude of the charge boost may depend on the MSB DAC code transition. The charge boost system 230 may be controlled by a controller (shown in phantom in FIG. 2). Embodiments of the charge boost system 230 are described below in further detail. As described herein, the charge boost system 230 may compensate for fast glitches by providing a boosting charge in the DAC system 200. As noted, glitches are artifacts of charge settling behavior. Accordingly, the charge boost system as described herein may provide appropriate charge to enhance the glitch performance by providing this charge directly to the DAC system when/where appropriate. The charge boost system may effectively bypass the DAC series impedance and thus reduce glitches.

Figure 3:
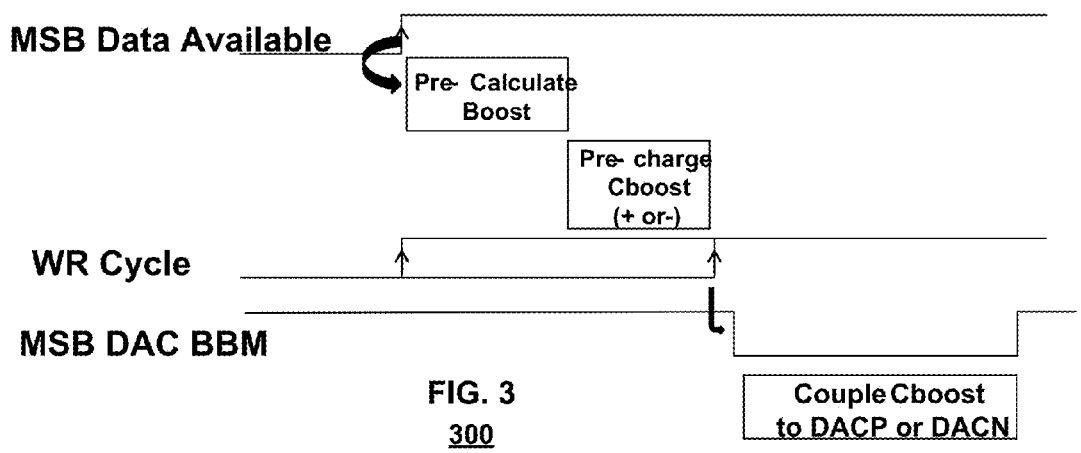
FIG. 3 illustrates timing diagram of charge boosting operations according to an embodiment of the present invention.

FIG. 3 is a timing diagram of charge boosting operations 300 according to an embodiment of the present invention. The charge boosting operations may include a pre-calculate boost operation, a pre-charged boost operation (before DAC code change), a charge boost coupling operation, and a charge boost decoupling operation.

Responsive to the next MSB data being available, the charge boost may be pre-calculated in the pre-calculate boost operation. The charge boost calculation may include the amount of charge boost and the polarity of the charge boost, and the charge boost calculation may be based on the difference between the current (old) MSB data and next (new) MSB data. In an embodiment, the pre-calculation may occur before, during, or after the write (WR) cycle. Based on the pre-calculated charge boost, the charge boost system $C_{boost}$ may be pre-charged. The pre-calculate and pre-charge operations may be performed while the DAC is converting the old digital data.

When the MSB DAC finishes the conversion of the old MSB data, the MSB DAC may break its connections (e.g., switch connections). The DAC may follow a break-before-make (BBM) connection technique. During the transition between breaking the connections for the old MSB data and making the connection for the new MSB data, the charge boost $C_{boost}$ may be coupled to an output of the MSB DAC, which is also coupled to the input to the LSB DAC. The charge boost $C_{boost}$ may be coupled to either the top or bottom of the LSB DAC (DACP or DACN). In an embodiment, the $C_{boost}$ may include one or more charge boosts (e.g., a $1^{st}$ $C_{boost}$ and a $2^{nd}$ $C_{boost}$). After $C_{boost}$ charge is injected into the DAC, $C_{boost}$ may be decoupled from the DAC, and the DAC may proceed to converting the next MSB data by making its new connections.

By injecting a charge boost into the DAC during a code transition period, embodiments of the present invention shorten the settling time of the secondary DAC (e.g., LSB DAC) voltage level changes between MSB DAC code transitions. Accordingly, embodiments of the present invention may reduce (or eliminate) glitches.

Figure 4:
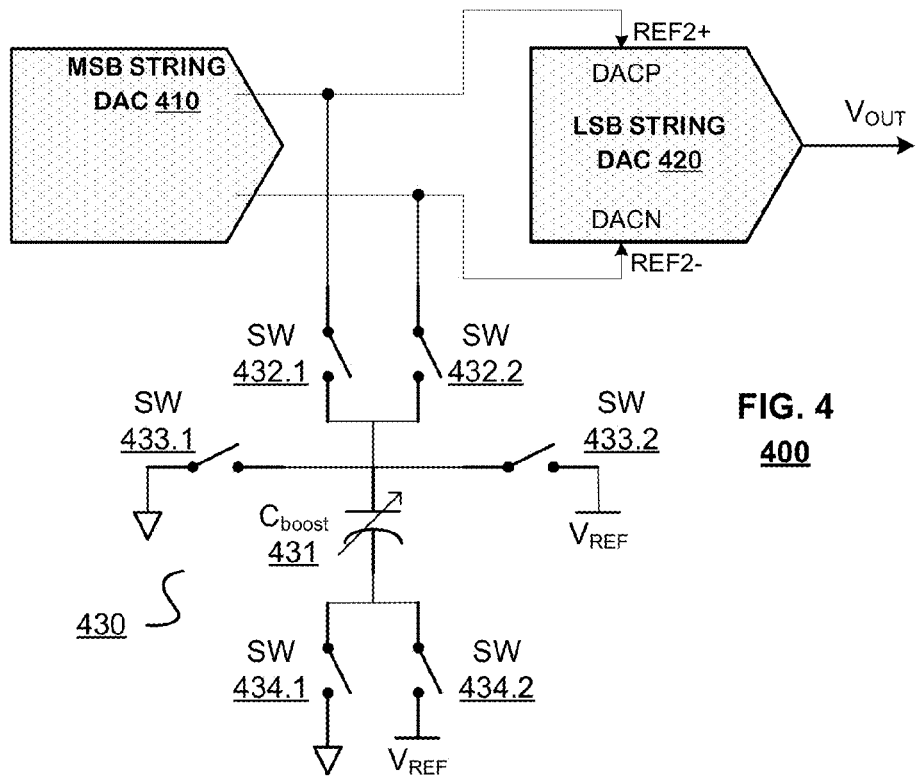
FIG. 4 illustrates a DAC system with charge boosting according to an embodiment of the present invention.

FIG. 4 is a DAC system 400 with charge boosting according to an embodiment of the present invention. The DAC system 400 may include an MSB DAC 410, an LSB DAC 420, and a charge boost system 430. The DAC system 400 may convert input digital word $D_{IN}$ into a converted analog voltage $V_{OUT}$. The MSB DAC 410 and LSB DAC 420 may be provided as described in other embodiments described herein (e.g., FIG. 2).

The charge boost system 430 may include a $C_{boost}$ capacitor 431, coupling switches 432.1, 432.2, and charging switches 433.1, 433.2, 434.1, 434.2. In an embodiment, the $C_{boost}$ capacitor 431 may be a variable capacitor and may be an asymmetric capacitor. The coupling switches 432.1, 432.2 may couple the $C_{boost}$ capacitor 431 to an MSB DAC 410 output/LSB DAC 420 input. For example, switch 432.1 may couple the $C_{boost}$ capacitor 431 to the top of the LSB DAC 420 (DACP), and switch 432.2 may couple the $C_{boost}$ capacitor 432 to the bottom of the LSB DAC 420 (DACN).

The charging switches 433.1, 433.2, 434.1, 434.2 may couple two voltage reference levels, for example VREF or GND, to the top or bottom plates of the $C_{boost}$ capacitor 431 to charge the $C_{boost}$ capacitor 431 with either a positive or negative charge. For example, to charge the $C_{boost}$ capacitor 431 positively with VREF, switches 433.2 and 434.1 may be closed to build a charge across the capacitor. Conversely, to charge the $C_{boost}$ capacitor 431 negatively with VREF, switches 433.1 and 434.2 may be closed to build a charge across the capacitor.

Figure 5A:
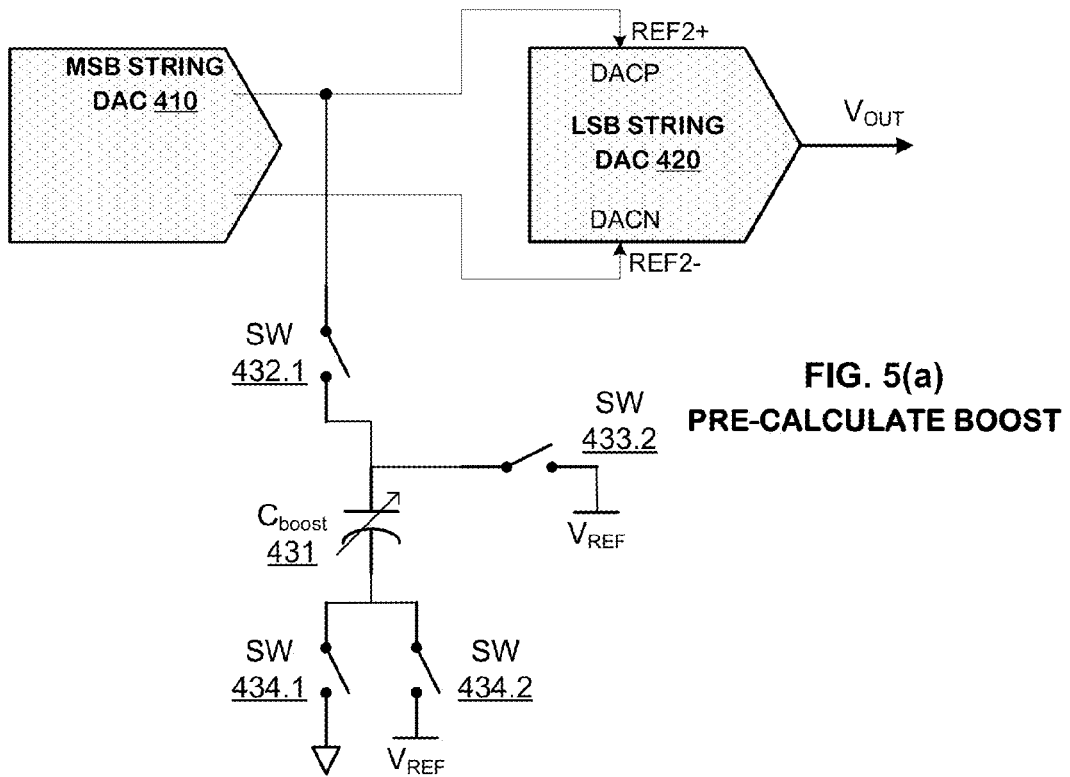
FIG. 5(a) illustrates a charge boosting operation according to an embodiment of the present invention.

FIGS. 5(a)-(f) illustrate an exemplary charge boost operation using the DAC system 400 of FIG. 4. For simplicity, only one branch of the charge boost system is shown. FIG. 5(a) illustrates a pre-calculate boost step. Here, a DSP (not shown) may calculate the pre-charge boost based on a comparison between the old MSB data, the new MSB data, and the boost circuit design. The charge amount and polarity may be based on the difference between the old and new MSB values. In an embodiment, the MSB value difference may be directly related to the charge amount. For example, a large MSB value difference may correspond to a large charge boost. Conversely, a small MSB value difference may correspond to a small charge boost. The relationship between the MSB value difference and the charge amount may depend on the DAC system circuit details. For example, the relationship may be linear or non-linear, as is the case in the DAC system 400 example. Furthermore, the charge polarity may be based on the direction of the MSB value change, which may dictate whether a positive or negative charge boost is needed. In the pre-calculate boost step, all switches may be set to an open position. In an embodiment, coupling switches 432.1 may be set to an open position when a charge is not being injected to optimize speed operations of the DAC system.

Figure 5B:
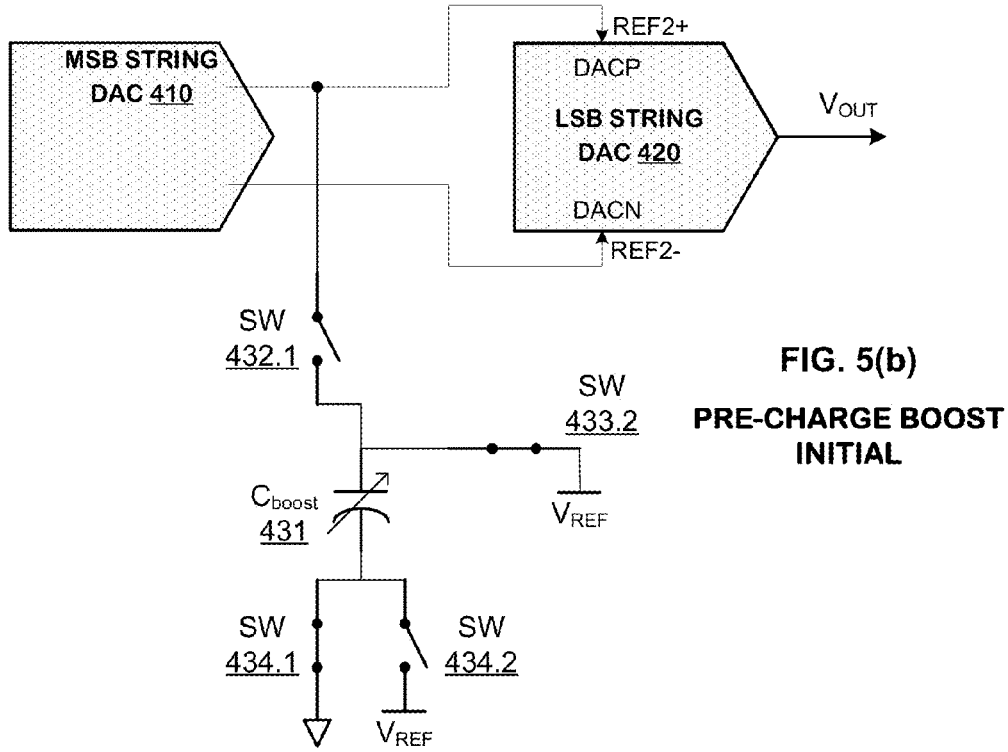
FIG. 5(b) illustrates a charge boosting operation according to an embodiment of the present invention.
Figure 5C:
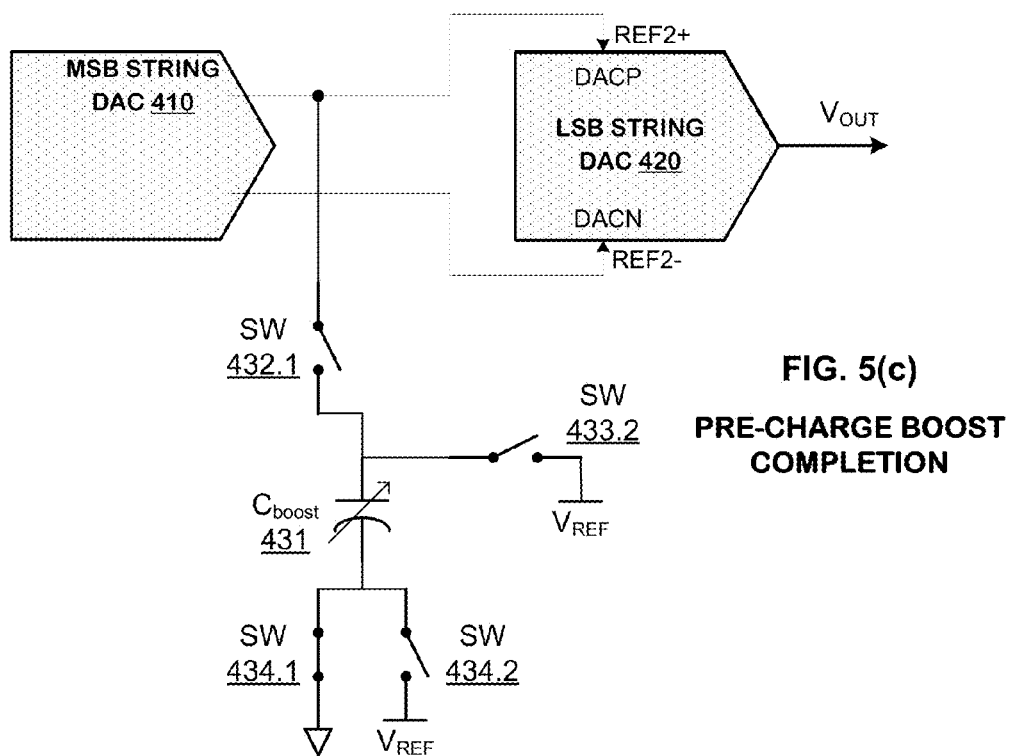
FIG. 5(c) illustrates a charge boosting operation according to an embodiment of the present invention.

FIG. 5(b) illustrates an initial pre-charge boost step. Based on the pre-calculation, the $C_{boost}$ capacitor 431 may be charged to the pre-calculated charge polarity and level. For instance, switch 433.2 and switch 434.1 may be closed to charge the top plate of the $C_{boost}$ capacitor 431 yielding a positive charge, $Q_{boost}=C_{boost}*V_{REF}$. FIG. 5(c) illustrates an completing pre-charge boost step. When pre-charge is completed, the voltage source $V_{REF}$ may be decoupled from the $C_{boost}$ capacitor 431. Hence, switch 433.2 may be opened.

Figure 5D:
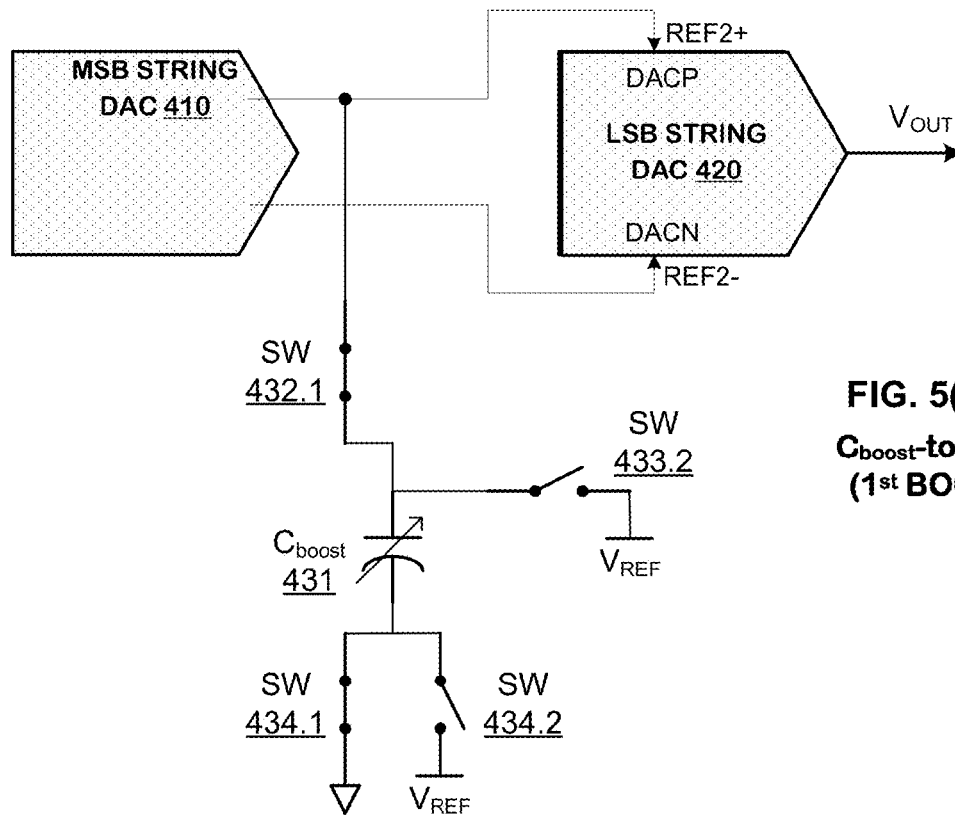
FIG. 5(d) illustrates a charge boosting operation according to an embodiment of the present invention.
Figure 5E:
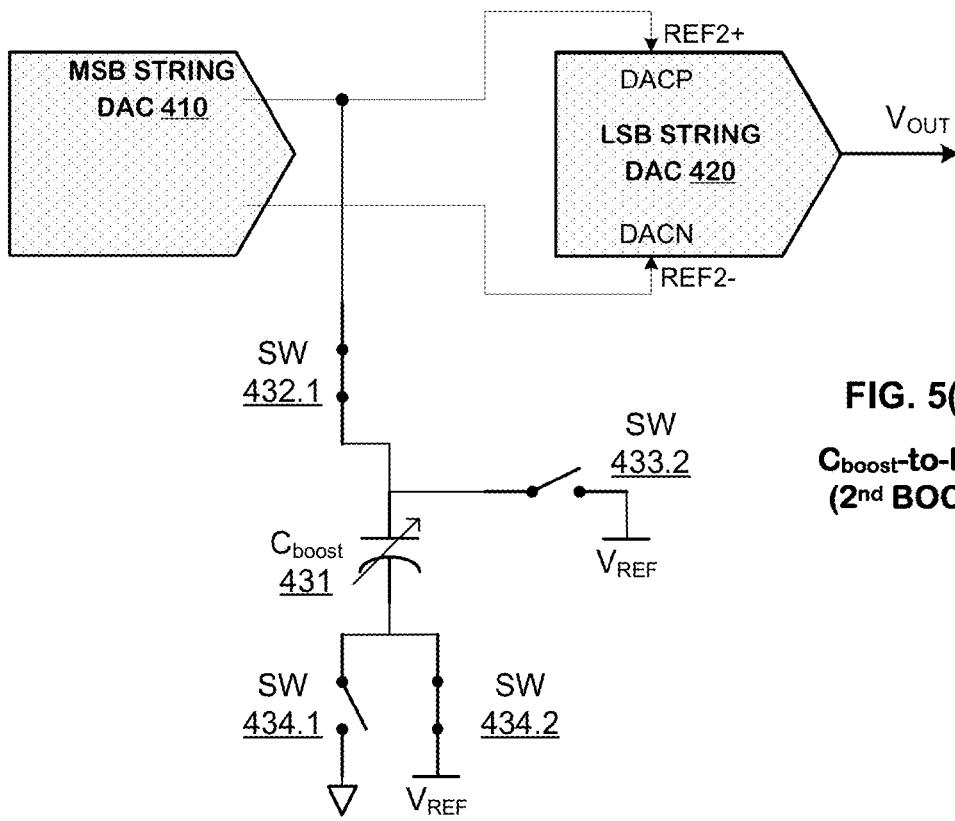
FIG. 5(e) illustrates a charge boosting operation according to an embodiment of the present invention.

Next, the stored charge boost may be injected. The charge boost injection may be performed during the transition between code values to be converted. In an embodiment, the charge boost may be injected in two phases—$1^{st}$ and $2^{nd}$ boost. FIG. 5(d) illustrates a $1^{st}$ boost step. Here, switch 432.1 may be closed to couple the $C_{boost}$ capacitor 431 to the DAC to apply a $1^{st}$ boost. Also, switch 434.1 may remain closed. FIG. 5(e) illustrates a $2^{nd}$ boost step. A $2^{nd}$ boost may be applied by opening switch 434.1 and switch 434.2 may be closed, for example in a break-before-make fashion. Switch 432.1 may remain closed to keep the $C_{boost}$ capacitor 431 coupled to the DAC.

Figure 5F:
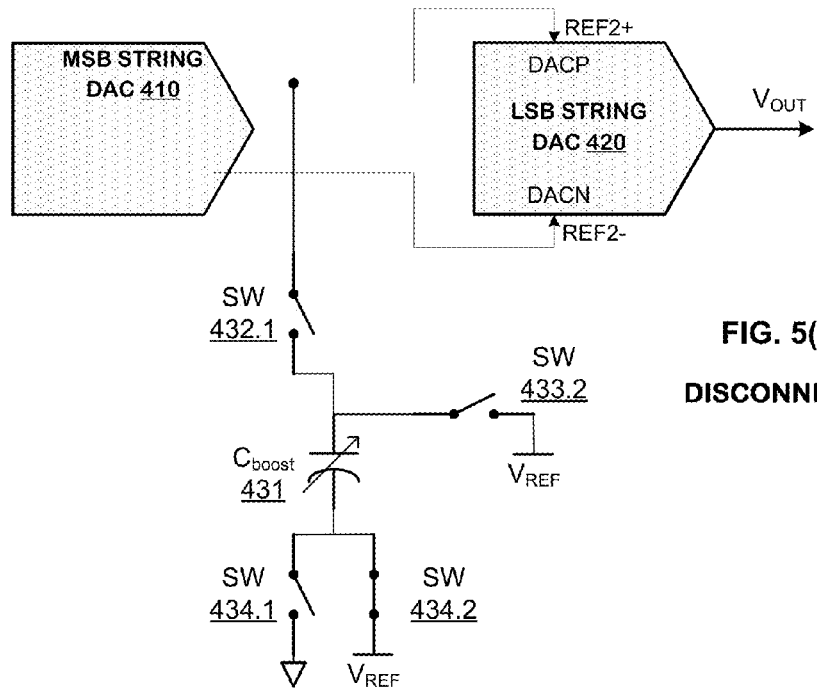
FIG. 5(f) illustrates a charge boosting operation according to an embodiment of the present invention.

FIG. 5(f) illustrates the final disconnect step. After the boost charge is transferred to the DAC, the switch 432.1 may be opened to decouple the $C_{boost}$ capacitor 431 from the DAC. The other switches may be held in their current position (i.e., leave in last state). In another embodiment, the other switches may be reset to an initial position.

Figure 6:
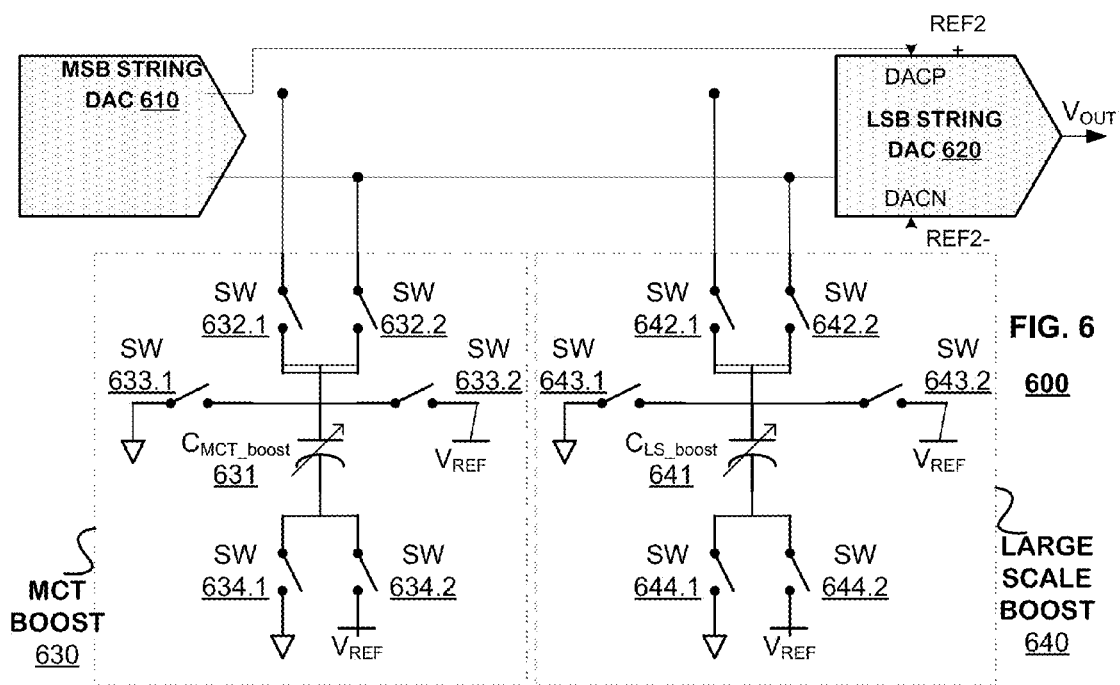
FIG. 6 illustrates a DAC system with charge boosting according to an embodiment of the present invention.

In an embodiment, two types of boost structures may be used to provide two different type of boosts—MCT (Major Code Transition) to cater for when the MSB code changes by a small amount (e.g., one MSB) and a Large Scale MSB change (e.g., greater than one MSB). FIG. 6 is a simplified block diagram of a DAC system 600 with MCT and Large Scale Boost according to an embodiment of the present invention. The DAC system 600 may include an MSB DAC 610, an LSB DAC 620, an MCT boost system 630, and a large scale boost system 640. The DAC system 600 may convert input digital word $D_{IN}$ into a converted analog voltage $V_{OUT}$. The MSB DAC 610 and LSB DAC 620 may be provided as described in other embodiments described herein (e.g., FIG. 2).

The MCT boost system 630 may include a $C_{MCT\_boost}$ capacitor 631, coupling switches 632.1, 632.2, and charging switches 631.1, 633.2, 634.1, 634.2. In an embodiment, the $C_{MCT\_boost}$ capacitor 631 may be a variable capacitor and may be an asymmetric capacitor. The coupling switches 632.1, 632.2 may couple the $C_{MCT\_boost}$ capacitor 631 to an MSB DAC 610 output/LSB DAC 620 input. For example, switch 632.1 may couple the $C_{MCT\_boost}$ capacitor 631 to the top of the LSB DAC 620 (DACP), and switch 632.2 may couple the $C_{MCT\_boost}$ capacitor 632 to the bottom of the LSB DAC 420 (DACN).

The charging switches 631.1, 633.2, 634.1, 634.2 may couple two voltage reference levels, for example VREF or GND, to the top or bottom plates of the $C_{MCT\_boost}$ capacitor 631 to charge the $C_{MCT\_boost}$ capacitor 631 with either a positive or negative charge. For example, to charge the top plate of the $C_{MCT\_boost}$ capacitor 631 with VREF, switches 633.2 and 634.1 may be closed to build a charge on the top plate. Conversely, to charge the bottom plate of the $C_{MCT\_boost}$ capacitor 631 with VREF, switches 633.1 and 634.2 may be closed to build a charge on the bottom plate.

The large scale boost system 640 may include a large-scale boost capacitor $C_{LS\_boost}$ capacitor 641, coupling switches 642.1, 642.2, and charging switches 643.1, 643.2, 644.1, 644.2. In an embodiment, the $C_{LS\_boost}$ capacitor 641 may be a variable capacitor and may be an asymmetric capacitor. The coupling switches 642.1, 642.2 may couple the $C_{LS\_boost}$ capacitor 641 to an MSB DAC 610 output/LSB DAC 620 input. For example, switch 642.1 may couple the $C_{LS\_boost}$ capacitor 641 to the top of the LSB DAC 620 (DACP), and switch 642.2 may couple the $C_{LS\_boost}$ capacitor 642 to the bottom of the LSB DAC 620 (DACN).

The charging switches 643.1, 643.2, 644.1, 644.2 may couple two voltage reference levels, for example VREF or GND, to the top or bottom plates of the $C_{LS\_boost}$ capacitor 641 to charge the $C_{LS\_boost}$ capacitor 641 with either a positive or negative charge. For example, to charge the top plate of the $C_{LS\_boost}$ capacitor 641 with VREF, switches 643.2 and 644.1 may be closed to build a charge on the top plate. Conversely, to charge the bottom plate of the $C_{LS\_boost}$ capacitor 641 with VREF, switches 643.1 and 644.2 may be closed to build a charge on the bottom plate.

Since the large scale boost system 640 may inject a larger magnitude charge into the DAC than the MCT boost system 630, the large scale boost system 640 must store and then discharge a larger charge. Hence, $C_{LS\_boost}$ capacitor 641 may have a larger value than $C_{MCT\_boost}$ capacitor 631, i.e., $C_{LS\_boost}$ capacitor 641>$C_{LS\_boost}$ capacitor 631. In an embodiment, the DAC system 600 may use the MCT boost system 630 to inject a charge boost during code transitions when the MSB code changes by one MSB and may use the large scale boost system to inject a charge boost during code transitions when the MSB codes changes by more than one MSB.

Figure 7:
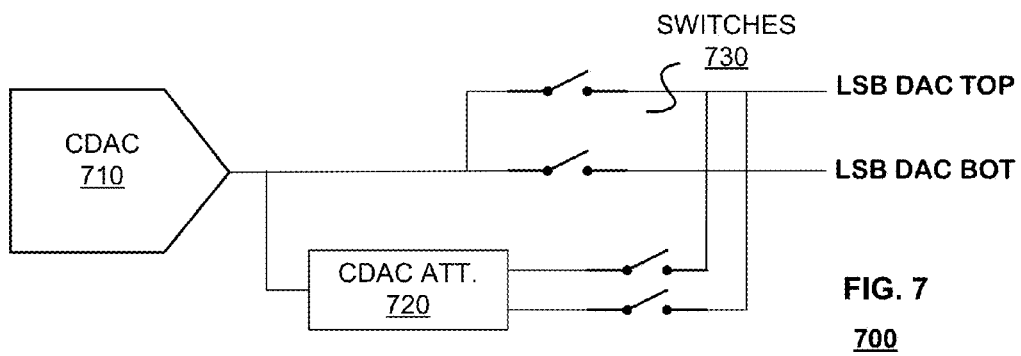
FIG. 7 illustrates a charge boosting system according to an embodiment of the present invention.

In an embodiment, the charge boost system may be implemented as a multi-range system using a capacitor DAC (CDAC) and a CDAC attenuator circuit. This implementation may provide both a MCT boost signal and a Large Scale boost signal. FIG. 7 is a simplified block diagram of a CDAC charge boost system 700 according to an embodiment of the present invention. The CDAC charge boost system 700 may include a CDAC 710, a CDAC attenuator 720, and switches 730. The CDAC attenuator 720 may be coupled to the CDAC 710 to attenuate the output of the CDAC 710 thus generating an attenuated (i.e., lower magnitude) boost signal. In an embodiment, the switches 730 may couple the CDAC 710 directly to the LSB DAC for a large scale boost signal and may couple the CDAC 710 through the CDAC attenuator 720 to the LSB DAC for a MCT boost signal. Of course, the switches 730 may be disposed on either side of the CDAC 710 and 720 to provide selective coupling as described above.

Figure 8:
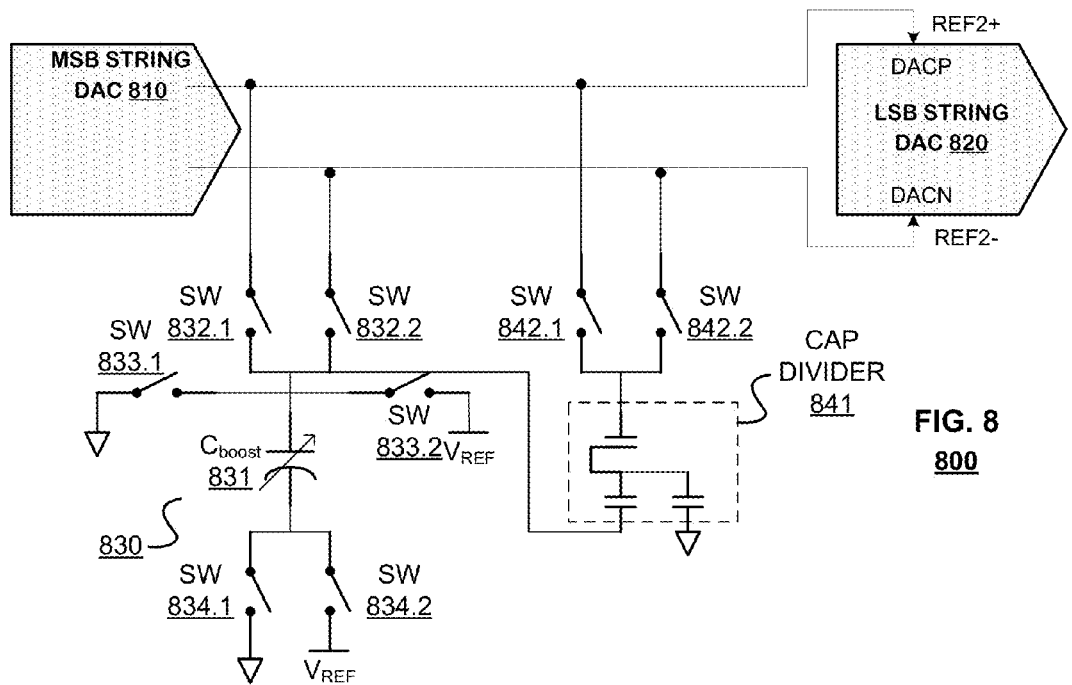
FIG. 8 illustrates a DAC system with charge boosting according to an embodiment of the present invention.

FIG. 8 is a DAC system 800 with a charge boost system using a capacitive divider according to an embodiment of the present invention. The DAC system 800 may include an MSB DAC 810, an LSB DAC 820, and a charge boost system 830. The DAC system 800 may convert input digital word $D_{IN}$ into a converted analog voltage $V_{OUT}$. The MSB DAC 810 and LSB DAC 820 may be provided as described in other embodiments described herein (e.g., FIG. 2).

The charge boost system 830 may include a $C_{boost}$ capacitor 831, coupling switches 832.1, 832.2, and charging switches 833.1, 833.2, 834.1, 834.2. In an embodiment, the $C_{boost}$ capacitor 831 may be a variable capacitor and may be an asymmetric capacitor. The coupling switches 832.1, 832.2 may couple the $C_{boost}$ capacitor 831 to an MSB DAC 810 output/LSB DAC 820 input. For example, switch 832.1 may couple the $C_{boost}$ capacitor 831 to the top of the LSB DAC 820 (DACP), and switch 832.2 may couple the $C_{boost}$ capacitor 832 to the bottom of the LSB DAC 820 (DACN). In an embodiment, the coupling switches 832.1, 832.2 may couple the $C_{boost}$ capacitor 831 to the DAC to provide a large scale charge boost signal.

The charging switches 833.1, 833.2, 834.1, 834.2 may couple two voltage reference levels, for example VREF or GND, to the top or bottom plates of the $C_{boost}$ capacitor 831 to charge the $C_{boost}$ capacitor 831 with either a positive or negative charge. For example, to charge the top plate of the $C_{boost}$ capacitor 831 with VREF, switches 833.2 and 834.1 may be closed to build a charge on the top plate. Conversely, to charge the bottom plate of the $C_{boost}$ capacitor 831 with VREF, switches 833.1 and 834.2 may be closed to build a charge on the bottom plate.

The charge boost system 800 may also include the capacitive divider 841 and coupling switches 842.1, 842.2 to provide a second magnitude charge boost signal (e.g., MCT boost signal). The capacitive divider 841 may include a group of capacitors arranged to divide a voltage. In an embodiment, the coupling switches 842.1, 842.2 may couple the capacitive divider 841 to the DAC to provide a MCT boost signal.

The DAC systems with charge boosting embodiments discussed herein may be implemented with analog mixed signal (AMS) circuitry. For example, AMS circuitry may be provided to control MCT and large scale boost transfer functions. Further, the two transfer functions may have different gains.

Figure 9:
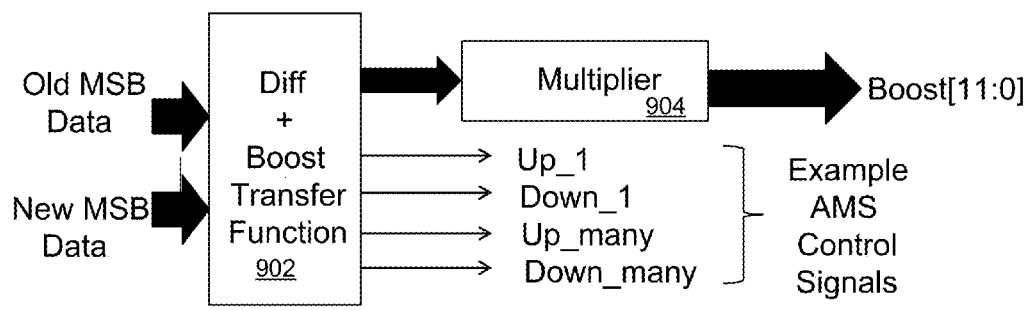
FIG. 9 illustrates of a charge boost control system according to an embodiment of the present invention.
Figure 10:
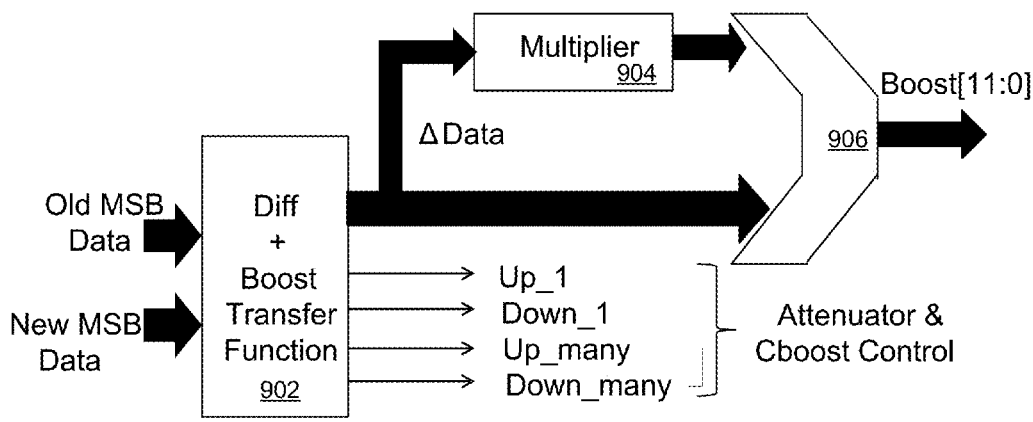
FIG. 10 illustrates of a charge boost control system according to an embodiment of the present invention.

Control signals to control charge boost systems described herein may be generated by digital circuitry, for example a digital signal processor (DSP). FIG. 9 is a simplified block diagram of charge boost control system according to an embodiment of the present invention. The system may include a transfer function module 902 and a multiplier 904. In this embodiment, one digital path may be provided for all cases. Boost may be activated according to the difference between old MSB data and new MSB data. For example, the signals Up_1 and Down_1 may be indicative of an MCT boost signal and the signals Up_many and Down_many may be indicative of a large scale boost signal. FIG. 10 is a simplified block diagram of charge boost control system according to another embodiment of the present invention. In the FIG. 10 embodiment, MCT and large scale boost signals may have separate paths (one with a multiplier and one without) that may be multiplexed by multiplexor 906.

Figure 11:
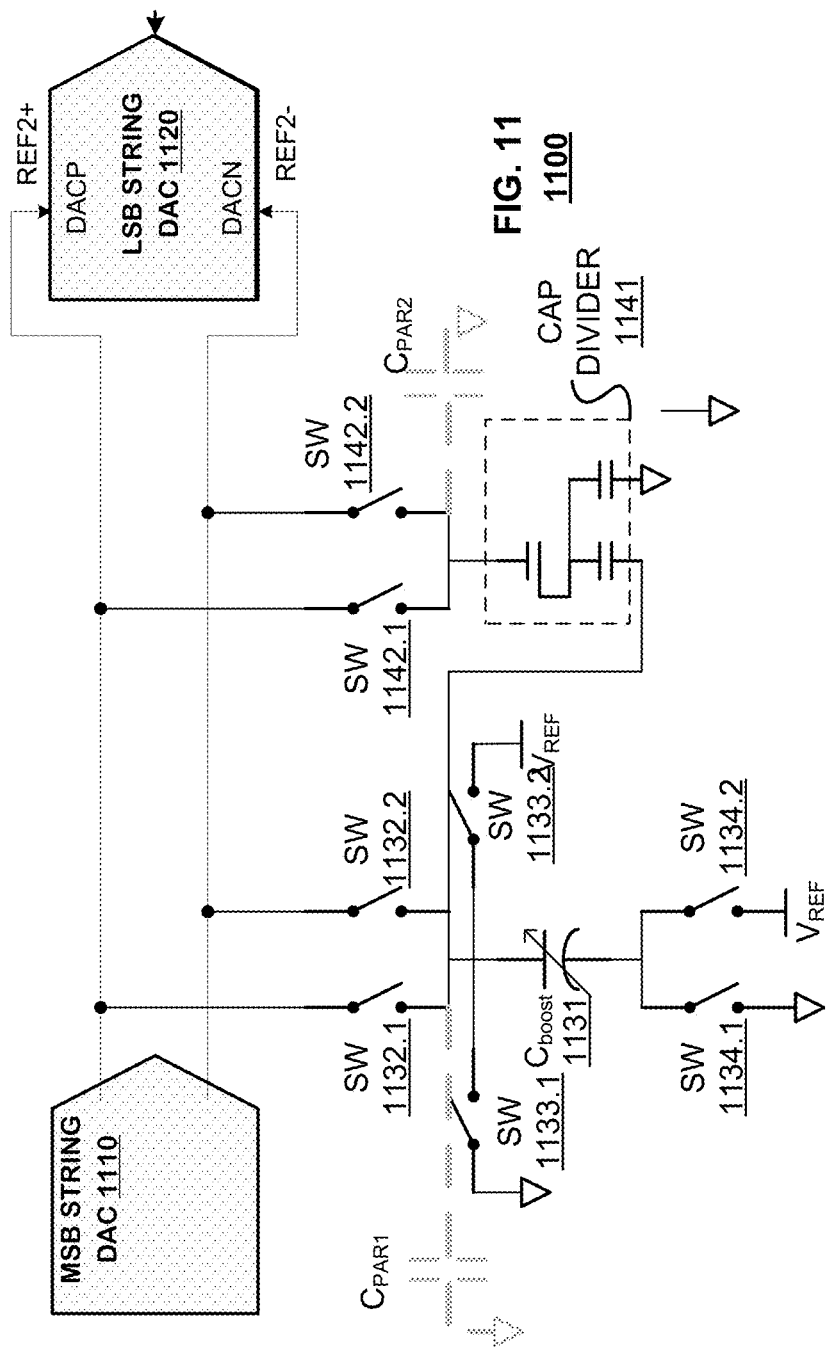
FIG. 11 illustrates parasitic capacitance in a DAC system with charge boosting according to an embodiment of the present invention.

Switched capacitor circuits like the charge boost systems described herein may suffer from parasitic capacitive issues as is known to those skilled in the art. FIG. 11 illustrates parasitic capacitances that may be present in a DAC system 1100. The DAC system 1100 is identical to DAC system 800 in FIG. 8 but showing parasitic capacitance effects in the system. Parasitic capacitance $C_{PAR1}$ represents the parasitic switch, interconnect and device capacitance as part of the large scale boost coupling circuitry. Parasitic capacitance $C_{PAR2}$ represents the parasitic switch and interconnect device capacitance as part of the MCT boost coupling circuitry.

To combat parasitic capacitive effects, embodiments of the present invention may provide parasitic capacitance reduction systems. FIG. 12 is a simplified block diagram of a CDAC charge boost system 1200 with parasitic capacitive compensation according to an embodiment of the present invention. The CDAC charge boost system 1200 may include a CDAC 1210, a CDAC attenuator 1220, a CDAC $C_{PAR1}$ compensation 1230, a CDAC $C_{PAR2}$ compensation 1240, and switches 1250. The CDAC attenuator 1220 may be coupled to the CDAC 1210 to attenuate the output of the CDAC 1210 thus generating an attenuated (i.e., lower magnitude) boost signal. In an embodiment, the switches 1250 may couple the CDAC 1210 directly to the LSB DAC for a large scale boost signal and may couple the CDAC 1210 through the CDAC attenuator 1220 to the LSB DAC for a MCT boost signal. The CDAC $C_{PAR1}$ Compensation 1230 may generate a charge to compensate for the parasitic capacitance (and its discharging) in the large scale boost coupling. The CDAC $C_{PAR1}$ Compensation 1240 may generate a charge to compensate for the parasitic capacitance (and its discharging) in the MCT boost coupling. Of course, the switches 1250 may be disposed on either side of the elements to provide selective coupling as described above. Further, the two cancellation blocks (CDAC $C_{PAR1}$ Compensation 1230 and CDAC $C_{PAR1}$ Compensation 1240) may be integrated together, and separate, explicit tuning/calibration may performed by AMS, partially AMS or digital techniques.

As described above, distributed RC settling of the LSB DAC may cause a "slow" glitch. A boosted charge coupled to or from the LSB DAC may reduce or eliminate the slow glitch. FIG. 13 is a DAC system 1300 with slow charge boosting according to an embodiment of the present invention. The DAC system 1300 may include an MSB DAC 1310, an LSB DAC 1320, and a slow charge boost system 1330. The DAC system 400 may convert input digital word $D_{IN}$ into a converted analog voltage $V_{OUT}$. The MSB DAC 1310 and LSB DAC 1320 may be provided as described in other embodiments described herein (e.g., FIG. 2).

The slow charge boost system 1330 may include a $C_{boost}$ capacitor 1331, coupling switches 1332.1, 1332.2, charging switches 1333.1, 1333.2, 1334.1, 1334.2, and a resistor $R_{SLOW}$ 1335. In an embodiment, the $C_{boost}$ capacitor 1331 may be a variable capacitor and may be an asymmetric capacitor. The coupling switches 1332.1, 1332.2 may couple the $C_{boost}$ capacitor 1331 to an MSB DAC 1310 output/LSB DAC 1320 input. For example, switch 1332.1 may couple the $C_{boost}$ capacitor 1331 to the top of the LSB DAC 1320 (DACP), and switch 1332.2 may couple the $C_{boost}$ capacitor 1332 to the bottom of the LSB DAC 1320 (DACN).

The charging switches 1333.1, 1333.2, 1334.1, 1334.2 may couple two voltage reference levels, for example VREF or GND, to the top or bottom plates of the $C_{boost}$ capacitor 1331 to charge the $C_{boost}$ capacitor 1331 with either a positive or negative charge. For example, to charge the top plate of the $C_{boost}$ capacitor 1331 with VREF, switches 1333.2 and 1334.1 may be closed to build a charge on the top plate. Conversely, to charge the bottom plate of the $C_{boost}$ capacitor 1331 with VREF, switches 1333.1 and 1334.2 may be closed to build a charge on the bottom plate.

The $R_{SLOW}$ 1335 may set the target speed of injecting the charge in the LSB DAC 1320. The slow charge may be injected after the BBM connection is made for the next MSB data conversion. In an embodiment, the $R_{SLOW}$ resistor may be made of the same resistor type and/or structure as the DAC resistance to compensate for manufacturing variance. Therefore, the slow charge boost system 1330 may inject a charge over a period of time to substantially reduce (or eliminate) glitches caused by RC settling time associated with the LSB DAC.

Figure 14:
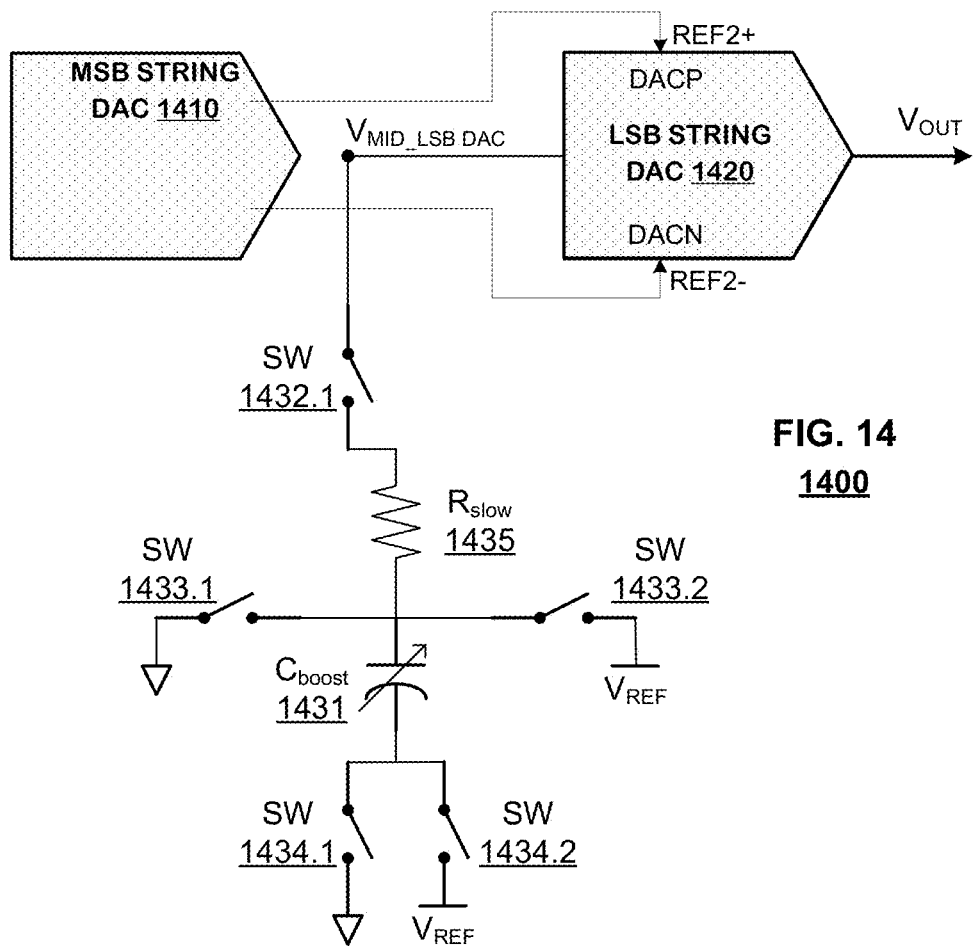
FIG. 14 illustrates a DAC system with charge boosting according to an embodiment of the present invention.

In another embodiment, slow boost may be coupled at/near the center of the LSB DAC since this is the point of highest $2^{nd}$ impedance string DAC output impedance. FIG. 14 is a DAC system 1400 with mid-connection slow charge boosting according to an embodiment of the present invention. DAC system 1400 is substantively similar to the DAC system 1300 in FIG. 13 except a coupling switch 1432.1 selectively couples the $C_{boost}$ capacitor 1431 via resistor $R_{SLOW}$ 1435 to a node at/near the center of the LSB DAC 1420. If the LSB DAC has an odd number of resistors (i.e., no center node), the connection may be at approximately at the center. FIG. 14 shows one coupling switch 1432.1 for illustration purposes; however, DAC system 1400 may include more than one coupling switch.

Furthermore, since fast boost may be designed to be outputted during the BBM transition window and slow boost may be designed for a longer period of time beyond the BBM transition window, circuitry for fast boost and slow boost as described in various embodiments herein may be shared. For example, the capacitor for fast boost may be re-used for slow boost after the BBM transition window, such as shortly after MSB DAC BBM transition in FIG. 3. Although the slow boost capacitor parameters may be different than the fast boost capacitor parameters, portions may be re-used with digital or analog attenuation. In an embodiment, a large capacitance may be used separately from or in combination with the fast boost capacitance.

Several embodiments of the present invention are specifically illustrated and described herein. However, it will be appreciated that modifications and variations of the present invention are covered by the above teachings. Other implementations are also within the scope of the present invention.

In other instances, well-known operations, components and circuits have not been described in detail so as not to obscure the embodiments. For example, two terminal resistors described herein are for description simplicity; however, two terminal resistors described herein may be generalized as impedance elements as is known to those skilled in the art. For example, three terminal impedance elements such as backplate elements or three terminal resistors may also be used and are not described here in detail so as not to obscure the embodiments. It can be appreciated that the specific structural and functional details disclosed herein may be representative and do not necessarily limit the scope of the embodiments. For example, track impedances may be implemented in the embodiments described herein. Moreover, embodiments of the present invention are described herein using resistor strings for illustration purposes; however, embodiments of the present invention may be implemented with other impedance string schemes. For example, MOS structures biased in un-saturated operations may be utilized in impedance string schemes.

I claim:

1. A string digital to analog converter (DAC), comprising:
an impedance network comprising a first and second impedance string;
a set of switches to couple a first voltage across the first impedance string to the second impedance string in a first code configuration and to couple a second voltage across the first impedance string to the second impedance string in a second code configuration; and
a charge boost circuit to inject a boost charge into the impedance network during a transition between the first code configuration and the second code configuration,
wherein a polarity of the boost charge is based on a comparison between first and second set of codes associated with the first and second code configurations respectively.

2. The string DAC of claim 1, wherein the charge boost circuit comprises a charge storage device.

3. The string DAC of claim 2, wherein the charge storage device is a variable capacitor.

4. The string DAC of claim 2, wherein the charge boost circuit further comprises a plurality of switches.

5. The string DAC of claim 4, wherein the plurality of switches includes at least one charging switch to selectively couple the charge storage device to a reference voltage source.

6. The string DAC of claim 4, wherein the plurality of switches includes at least one coupling switch to selectively couple the charge storage device to the impedance network.

7. The string DAC of claim 1, wherein the charge boost circuit comprises two charge boost components, a first component to inject a first charge and a second component to inject a second charge, wherein the second charge is greater than the first charge.

8. The string DAC of claim 7, wherein the charge boost circuit is configured to apply either the first charge or the second charge during the transition based on a comparison of first and second codes associated with the first and second code configurations respectively.

9. The string DAC of claim 1, wherein the charge boost circuit comprises a capacitor DAC.

10. The string DAC of claim 9, wherein the charge boost circuit further comprises an attenuator coupled to the capacitor DAC.

11. The string DAC of claim 1, wherein the charge boost circuit comprises a capacitor divider network.

12. The string DAC of claim 1, wherein the charge boost circuit comprises a parasitic capacitance reduction device.

13. A string digital to analog converter (DAC), comprising:
an impedance network comprising a first and second impedance string;
a set of switches to couple a first voltage across the first impedance string to the second impedance string in a first code configuration and to couple a second voltage across the first impedance string to the second impedance string in a second code configuration; and
a charge boost circuit to inject a charge after a transition between the first code configuration and the second code configuration,
wherein a polarity of the charge is based on a comparison of codes associated with first and second code configurations.

14. The string DAC of claim 13, wherein the charge is injected during the second code configuration.

15. The string DAC of claim 13, wherein the charge boost circuit includes a resistor.

16. The string DAC of claim 13, wherein the charge boost circuit is selectively coupled to a substantial midpoint of the second resistor string.

17. A method of converting two digital signals into respective analog signals, comprising:
converting a first digital signal into a first analog signal using a multi-string DAC;
converting a second digital signal into a second analog signal using the multi-string DAC; and
injecting a boost charge signal into the multi-string DAC during a transition between the first and second digital signal conversions,
wherein a polarity of the boost charge signal is based on a comparison of the first and second digital signals.

18. The method of claim 17, further comprises injecting a second boost charge signal during a transition between the first and second digital signal conversions.

19. The method of claim 17, further comprises injecting a slow boost charge signal during the conversion of the second digital signal.

20. A string digital to analog converter (DAC), comprising:
a resistive network comprising a first and second resistor string, each string comprising a plurality of series-coupled resistors;
a switch array selectively connecting intermediate nodes in the first resistor string to terminal ends of the second resistor string, the switch array responsive to input control codes to configure the selective connections between the first and second resistor string; and
a charge boost circuit to inject a charge into the string DAC during a transition between a first control code and a second control code,
wherein a polarity of the charge is based on a comparison of the first control code and second control code.

21. The string DAC of claim 20, wherein the charge is injected into the resistive network.

22. The string DAC of claim 20, wherein the charge is injected into the switch array.

* * * * *